United States Patent
Rauth et al.

(10) Patent No.: US 8,683,992 B2
(45) Date of Patent: Apr. 1, 2014

(54) COOKTOP ASSEMBLY COMPRISING FLUSH-MOUNTED COOKTOP PANEL

(75) Inventors: Dominik Rauth, Gebsattel (DE); Erhard Kaser, Colmberg (DE)

(73) Assignee: Electrolux Home Products Corporation N.V., Zaventem (BE)

( * ) Notice: Subject to any disclaimer, the term of this patent is extended or adjusted under 35 U.S.C. 154(b) by 431 days.

(21) Appl. No.: 13/000,398

(22) PCT Filed: Aug. 31, 2009

(86) PCT No.: PCT/EP2009/006281
§ 371 (c)(1),
(2), (4) Date: Dec. 21, 2010

(87) PCT Pub. No.: WO2010/031495
PCT Pub. Date: Mar. 25, 2010

(65) Prior Publication Data
US 2011/0100353 A1  May 5, 2011

(30) Foreign Application Priority Data
Sep. 17, 2008 (EP) .................................. 08016333

(51) Int. Cl.
*F24C 3/00* (2006.01)
(52) U.S. Cl.
USPC ...................... 126/39 BA; 345/184; 381/109
(58) Field of Classification Search
USPC ........................ 126/39 BA; 345/184; 381/109
See application file for complete search history.

(56) References Cited

U.S. PATENT DOCUMENTS

| 5,450,075 | A | * | 9/1995 | Waddington | 340/870.28 |
| 7,778,118 | B2 | * | 8/2010 | Lyons et al. | 368/69 |
| 7,906,875 | B2 | * | 3/2011 | Caldwell et al. | 307/139 |
| 8,199,114 | B1 | * | 6/2012 | Jaeger et al. | 345/173 |
| 8,217,915 | B2 | * | 7/2012 | Philipp | 345/174 |
| 2004/0070574 | A1 | * | 4/2004 | Wylie et al. | 345/184 |
| 2005/0052429 | A1 | * | 3/2005 | Philipp | 345/173 |
| 2008/0238879 | A1 | * | 10/2008 | Jaeger et al. | 345/173 |
| 2009/0009491 | A1 | * | 1/2009 | Grivna | 345/184 |
| 2009/0059730 | A1 | * | 3/2009 | Lyons et al. | 368/69 |

FOREIGN PATENT DOCUMENTS

| DE | 10304985 | | 7/2004 | | |
| DE | 10304985 B3 | * | 7/2004 | | H03K 17/94 |
| DE | 10326157 | | 12/2004 | | |
| EP | 1962167 | | 8/2008 | | |
| EP | 1962167 A1 | * | 8/2008 | | G05G 1/10 |

OTHER PUBLICATIONS

International Search Report for PCT/EP2009/006281 dated Dec. 17, 2009, 2 pages.

* cited by examiner

*Primary Examiner* — Jorge Pereiro
(74) *Attorney, Agent, or Firm* — Pearne & Gordon LLP

(57) ABSTRACT

The invention relates to an adjusting device (10;30;40) for adjusting and/or selecting one or more parameters of an appliance (50), wherein the adjusting device (10;30;40) comprises touch sensitive sensors (14), which are arranged in row, and a processing unit (18) for processing output signals of the sensors (14), whereas the processing unit (18) is designed in such a manner that an adjustment and/or a selection of parameters is realized by touching at least two of the sensors (14) in sequence, whereas the sensors (14) are arranged around a circumference of a torque proof actuation element (12).

3 Claims, 2 Drawing Sheets

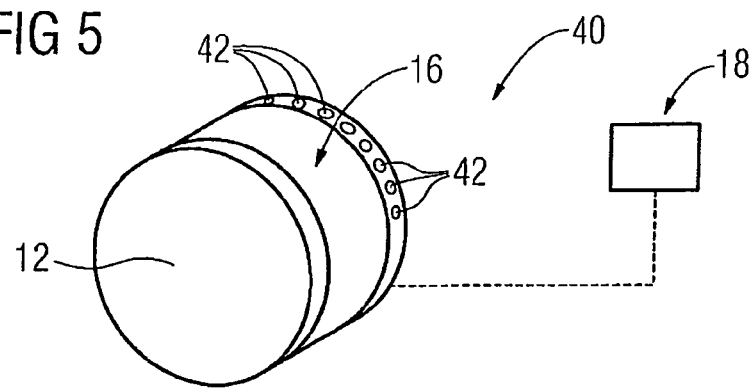
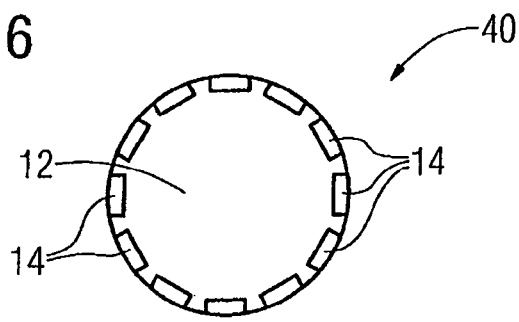
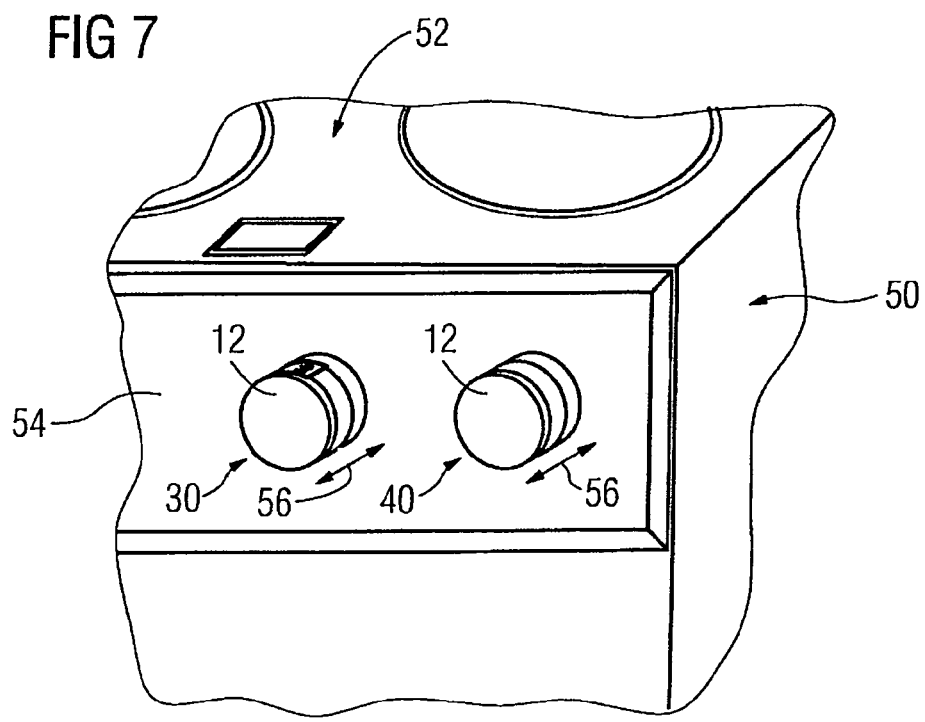

COOKTOP ASSEMBLY COMPRISING FLUSH-MOUNTED COOKTOP PANEL

TECHNICAL FIELD

The present invention relates to an adjusting device for adjusting and/or selecting one or more parameters of an appliance, such as the temperature of an oven or cooker, a predetermined program of a washing machine or dish washer, etc.

BACKGROUND TECHNOLOGY

Adjusting devices of the above mentioned kind are already known in many different designs. They may be provided as conventional rotary switches, which allow a stepwise or continuous adjustment of parameters. However, due to the rotary axis required for turning the switch, the bearing of the rotary axis, and, if necessary, the sealing of the rotary axis, such rotary switches are quite expensive in view of production and installation.

Moreover, adjusting devices may comprise one or more touch sensitive sensors, e.g. capacitive sensors, which are coupled to a processing unit for processing the output signals of the sensors. The processing unit is designed in such a manner, that an adjustment or a selection of one or more parameters is realized by touching a sensor one or several times with the finger. According to DE 103 13 401 A1, such touch sensitive sensors can also be arranged in a common plane and extend in an endless row. In this case, the processing unit is designed in such a manner that an adjustment or a selection of parameters is realized by touching or running one's fingers over at least two sensors in sequence. Touch sensitive sensors have the advantage that a rotary axis is not necessary. Accordingly, the production and installation costs can be reduced compared to the ones of rotary switches.

However, when adjusting devices with touch sensitive sensors, in particular an adjusting device of the kind described in DE 103 13 401 A1, are used for an appliance having a small installation height, such as conventional cookers, ovens, dishwashers or washing machines, the sensors should not be arranged on a vertical plane, e.g. on a vertically extending control panel, because a user would have to stoop down in order to operate the device, which is rather uncomfortable. Accordingly, the sensors are normally placed on a horizontal plane, e.g. on a Ceran-cooktop, on a control panel provided on the upper side of the appliance or the like. However, if the sensors are arranged on a Ceran-cooktop, they take away space needed for the cooking fields of the Ceran-cooktop. Moreover, washing machines, dishwashers and similar appliances are often integrated in kitchenettes, closets, etc., so that the upper side of the appliance and hence the sensors are not accessible by a user.

Starting from the above-mentioned prior art, it is an object of the present invention to provide an adjusting device for adjusting and/or selecting one or more parameters of an appliance, which is inexpensive to manufacture and to assemble and which is comfortable to handle when it is installed on a vertical plane, such as on a vertical extending control panel.

DISCLOSURE OF THE INVENTION

This object is solved by providing an adjusting device for adjusting and/or selecting one or more parameters of an appliance, whereas the adjusting device comprises touch sensitive sensors, which are arranged in a row, and a processing unit for processing output signals of the sensors, whereas the processing unit is designed in such a manner that an adjustment and/or a selection of the parameters is realized by touching or running one's fingers over at least two sensors in sequence. According to the invention, the sensors are arranged around the circumference of a torque prove actuation element, which is preferably cylindrically shaped. In other words the present invention provides an adjusting device having an actuation element which resembles a rotary switch—however, the actuation element is torque prove and the rotation of the conventional rotary switch is replaced by running one's fingers over the touch sensitive sensors arranged around the circumference of the actuation element.

Accordingly, compared to conventional rotary switches, the adjusting device according to the present invention does not need a rotary axis. Thus, the production and installation costs can be reduced. Moreover, the handling of the adjusting device according to the present invention is very similar to the one of a conventional rotary switch, so that a user will not have any problems with its manipulation. Due to the arrangement of the touch sensitive sensors around the circumference of the actuation element, the sensors can be comfortably handled by a user when the actuation element is arranged on a vertical plane, such as a vertically extending control panel of an oven, a cooker, a washing machine, a dishwasher, etc. In this regard the adjusting device according to the present invention poses an improvement with respect to the known adjusting devices having touch sensitive sensors.

The actuation element is preferably arranged at an appliance in a linear movable manner. Advantageously, the actuation element is movable between a first position, in which it is countersunk in a control panel (non-operating position), and a second position, in which it projects from said control panel (operating position). Accordingly, the actuation element cannot be damaged when it is arranged in the first position. Moreover, the appearance of the operation board is enhanced due to the immersible arrangement of the actuation element.

Preferably the adjusting device comprises a display for displaying the actual adjustment or selection of a parameter. The display may be integrated in the actuation element. Additionally or alternatively the display or a further display may be provided elsewhere on the control panel, the Ceran-cooktop, etc.

Moreover, lights, e.g. LED's, can be provided for visualizing the actual adjustment of the parameter, whereas the lights are preferably arranged around the circumference of the actuation element.

The present invention also provides an appliance comprising a switching device of the above-mentioned kind, e.g. an oven, a cooker, a dishwasher, a washing machine, a dryer, etc.

BRIEF DESCRIPTION OF THE ACCOMPANYING DRAWINGS

The detailed configuration, features and advantages of the present invention will become apparent in the course of the following description with reference to accompanying drawings.

FIG. 5 is a perspective view of an adjusting device according to a third embodiment of the present invention;

FIG. 6 is a sectional view of the adjusting device shown in FIG. 5, whereas the section plane extends through touch sensitive sensors of the adjusting device; and FIG. 7 is a perspective partial view of a domestic oven.

Below, three embodiments of the present invention will be described with reference to the figures. In the figures, like parts are denoted by like reference numerals, and redundant descriptions will be omitted.

Figure 1:
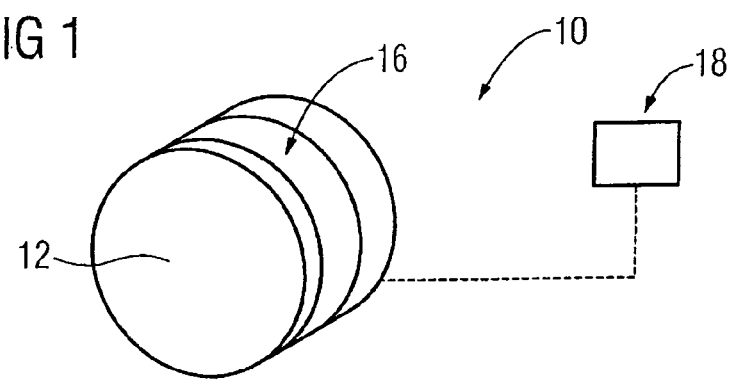
FIG. 1 is a perspective view of an adjusting device according to a first embodiment of the present invention.
Figure 2:
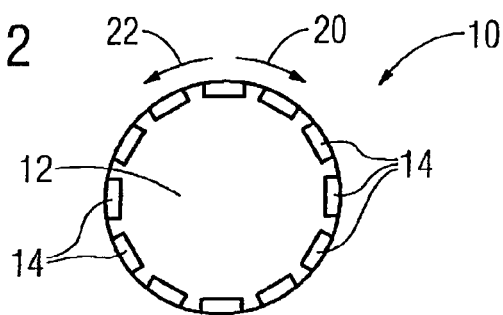
FIG. 2 is sectional view of the adjusting device shown in FIG. 1, whereas the section plane extends through touch sensitive sensors of the adjusting device.

FIGS. 1 and 2 show an adjusting device 10 according to a first embodiment of the present invention. The adjusting 10 serves for adjusting and/or selecting one or more parameters of an appliance, e.g. the temperature or an operation mode of an oven, a cooker, a dishwasher, a washing machine, a dryer or the like. The adjusting device 10 comprises an actuation element 12, which is cylindrically shaped. Touch sensitive sensors 14 are arranged in an endless row around the circumference of the actuation element 12, whereas the sensors 14 form a ring shaped sensor field 16. The touch sensitive sensors 14 are electrically connected to a processing unit 18 for processing output signals of the sensors 14. The processing unit 18 is designed in such a manner that an adjustment or a selection of parameters is realized by touching at least two of the sensors 14 in sequence. In other words, the parameter to be adjusted by the adjusting device 10 is changed, when a user runs his finger along the ring shaped sensor field 16 over at least two touch sensitive sensors 14. The processing unit 18 is designed in such a manner, that the parameter, such as the temperature of a Ceran-cooktop, is elevated, when a finger of a user is run in the direction of arrow 20 over at least two touch sensitive sensors 14, and reduced, when sensors 14 are touched in sequence in the other direction indicated by arrow 22.

In other words the adjusting device 10 imitates a conventional rotary switch. However, the rotary movement of a conventional rotary switch around a rotary axis is replaced by running one's fingers along the circumference of the actuation element 12 over a plurality of the touch sensitive sensors 14. Accordingly, the actuation element 12 does not need a rotary axis, so that the production and installation cost can be lowered.

Figure 3:
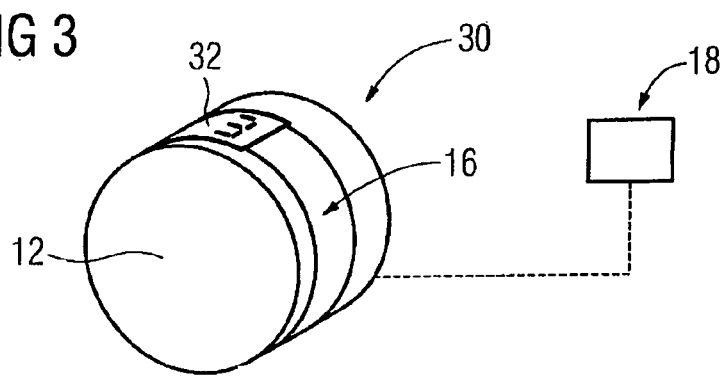
FIG. 3 is a sectional view of an adjusting device according to a second embodiment of the present invention.
Figure 4:
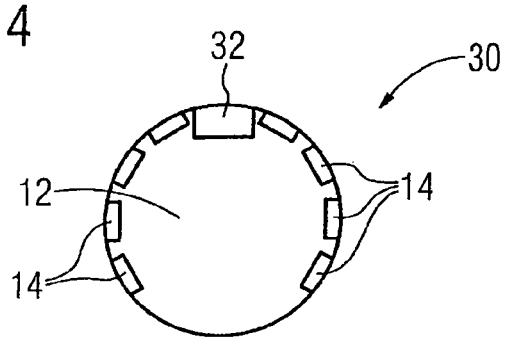
FIG. 4 is a sectional view of the adjusting device shown in FIG. 3, whereas the section plane extends through touch sensitive sensors of the adjusting device.

FIGS. 3 and 4 show and adjusting device 30 according to a second embodiment of the present invention. The adjusting device 30 comprises an actuation element 12 having a cylindrical shape. An upwardly facing display 32 is integrated in the circumferential wall of the actuation element 12 and serves for displaying the actual adjustment of the parameter in question. Touch sensitive sensors 14 are arranged in a row along the circumference of the actuation element 12, more precisely on the left and right side of the display 32. However, in contrast to the embodiment shown in FIGS. 1 and 2, the touch sensitive sensors 14 are not arranged in an endless row. The sensors 14 are connected to a processing unit 18, which is designed in such a manner, that an adjustment or selection of parameters is realized by touching at least two of the sensors 14 in sequence, as it was described before with respect to the first embodiment.

FIGS. 5 and 6 show an adjusting device 40 according to a third embodiment of the present invention. The adjusting device 40 comprises an actuation element 12 of cylindrical shape, touch sensitive sensors 14 arranged in a row around the circumference of the actuation element 12, and lights 42, e.g. LED's, which are provided along the circumference of the actuation element 12 for visualizing the actual adjustment of the parameter in question. The number of lighted lights 42 corresponds to an adjusting level of the parameter.

FIG. 7 partially shows an appliance 50 in form of a conventional oven having a Ceran-cooktop 52. The appliance 50 has a vertically extending control panel 54, which comprises an adjusting device 30 according to the second embodiment and an adjusting device 40 according to the third embodiment. The actuation elements 12 of both adjusting devices 30 and 40 are arranged torque prove on the control panel 54, such that they are not turnable by a user. Moreover, the actuation elements 12 of both devices 30 and 40 are arranged in such a manner, that they are linearly movable between a first position, in which the actuation elements 12 are countersunk in the control panel 54, and a second position, in which they project from the control panel 54, as it is indicated by means of arrows 56.

LIST OF REFERENCE SIGNS 10 adjusting device
12 actuation element
14 sensitive sensors
16 sensor field
18 processing unit
20 arrow
22 arrow
30 adjusting device
32 display
40 adjusting device
42 lights
50 appliance
52 Ceran-cooktop
54 control panel
56 arrows

The invention claimed is:

1. Adjusting device for adjusting and/or selecting one or more parameters of an appliance, whereas the adjusting device comprises touch sensitive sensors, which are arranged around a portion of a circumference of a torque-proof actuation element thereby forming a gap between two of the sensors, the actuation element being arranged in a linear movable manner;

an upwardly facing display incorporated in a circumferential wall of the actuation element and along the gap between said two of the sensors, wherein the upwardly facing display displays an actual adjustment of the one or more parameters; and a processing unit for processing output signals of the sensors, whereas the processing unit is designed in such a manner that an adjustment and/or a selection of parameters is realized by touching at least two of the sensors in sequence.

2. Adjusting device according to claim 1, characterized in that the actuation element is cylindrical shaped.

3. Adjusting device according to claim 1, characterized in that the actuation element is linearly movable between a first position, in which it is countersunk in a control panel, and a second position, in which it projects from said control panel.

* * * * *